United States Patent [19]
Fujisaki et al.

[11] Patent Number: 4,758,875
[45] Date of Patent: Jul. 19, 1988

[54] RESIN ENCAPSULATED SEMICONDUCTOR DEVICE

[75] Inventors: Koji Fujisaki; Akio Nishikawa; Shunichi Numata; Hiroshi Suzuki, all of Hitachi; Takeshi Komaru, Tachikawa; Daisuke Makino, Hitachi, all of Japan

[73] Assignees: Hitachi, Ltd.; Hitachi Chemical Co. Ltd., both of Tokyo, Japan

[21] Appl. No.: 266,198

[22] Filed: May 22, 1981

[30] Foreign Application Priority Data

Apr. 30, 1981 [JP] Japan ................... 56-66374

[51] Int. Cl.$^4$ ................. H01L 23/48; H01L 23/28; H01L 29/34
[52] U.S. Cl. ........................ 357/72; 357/71; 357/54; 357/52
[58] Field of Search ............ 357/71, 72, 54, 52; 427/82; 528/182

[56] References Cited

U.S. PATENT DOCUMENTS

| | | | |
|---|---|---|---|
| 3,926,914 | 12/1975 | Miyadera et al. | 528/182 OR |
| 4,001,870 | 1/1977 | Saiki et al. | 357/54 OR |
| 4,017,886 | 4/1977 | Tomono et al. | 357/54 OR |
| 4,040,083 | 8/1977 | Saiki et al. | 357/72 X |
| 4,060,383 | 11/1977 | Satonaka | 357/71 OR |
| 4,064,289 | 12/1977 | Yokoyama et al. | 427/82 OR |
| 4,072,982 | 2/1978 | Stein | 357/55 X |
| 4,079,511 | 3/1978 | Grabbe | 29/627 |
| 4,238,528 | 12/1980 | Angelo et al. | 427/82 X |
| 4,354,965 | 10/1982 | Lee et al. | 528/182 X |

FOREIGN PATENT DOCUMENTS 5008469 1/1975 Japan .
5006280 1/1975 Japan .
5006279 1/1975 Japan .

OTHER PUBLICATIONS

A. Saiki et al, "A New Transistor with Two-Level Metal Electrodes", *Journal of The Electrochemical Society*, vol. 124 (1977), pp. 1619-1622.

K. Mukai et al, "Planar Multilevel Interconnection Technology Employing a Polyimide", *IEEE Journal of Solid-State Circuits*, vol. SC-13 (1978), pp. 462-467.

J. K. Posa, "What to Expect Next: A Special Report" *Electronics*, May 22, 1980, pp. 119-129.

W. C. Ward, "Alpha Particle Shield", *IBM Technical Disclosure Bulletin*, vol. 22 (1979), p. 1398.

*Primary Examiner*—J. Carroll
*Attorney, Agent, or Firm*—Antonelli, Terry & Wands

[57] ABSTRACT

Disclosed is a resin encapsulated semiconductor memory device comprising a semiconductor memory element, a package encapsulating the memory element and an α-rays shielding layer made from a water-resistant aromatic polyimide polymer, interposed between the memory element and the package, the aromatic polyimide polymer having a saturated water absorption rate of 1% or less. The polyimide polymer is exemplified as the polymer having the following recurring units:

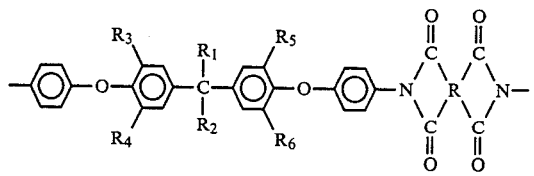

wherein R is an aliphatic or aromatic group; $R_1$ and $R_2$ are independently a hydrogen atom, an alkyl group having 1 to 4 carbon atoms or $CF_3$; and $R_3$ to $R_6$ are independently a hydrogen atom, a halogen atom or an alkyl group having 1 to 4 carbon atoms. The disclosure is also concerned with resin encapsulated semiconductor devices in which the aromatic polyimide polymer of low water absorption is used as an insulating layer or passivation film.

4 Claims, 1 Drawing Sheet

RESIN ENCAPSULATED SEMICONDUCTOR DEVICE

FIELD OF THE INVENTION

This invention relates to a resin encapsulated semiconductor device, and in particular to an improvement of a semiconductor device having a semiconductor functioning element molded with an encapsulating resin wherein a polyimide resin is used as a material for passivation, α-rays shielding or insulation of multilevel metal layers.

BACKGROUND OF THE INVENTION

Since the exposed terminal surface of pn-junction formed on semiconductor substrate is sensible to the outer atmosphere, it is stabilized by coating it with various passivating materials. In Japanese Patent Application Kokai (Laid-Open) No. 8,469/75, there is disclosed a passivation technique by the use of a polyimide resin in place of an inorganic passivation material such as silicon dioxide, silicon nitride, alumina, glass or the like, and said technique is advantageous in that the stabilizing technique can be practised at a low temperature. The polyimide resin disclosed in said patent specification is that obtained from pyromellitic acid dianhydride, benzophenonetetracarboxylic acid dianhydride, diamino diphenyl ether and diamino monocarboxamide diphenyl ether. And, it is mentioned to pre-treat the semiconductor substrate and the like with an aminosilane coupling agent for the sake of improving the adhesion between the polyimide resin and the semiconductor substrate and the like.

In Japanese Patent Application Kokai (Laid-Open) Nos. 6,279/75 and 6,280/75, there is disclosed a technique for forming a bonding layer of polyimide or the like between encapsulation resin and semiconductor integral circuit chip or between the undercoat formed on the chip and the chip to decrease the failure of IC device due to the invasion of water from the outer atmosphere. In U.S. Pat. No. 4,079,511, there is also disclosed a semiconductor device which is covered with a sealant so that water does not reach the integral circuit chip.

Further, in U.S. Pat. Nos. 4,001,870, 4,017,886, 4,040,083 and 4,060,828, there is disclosed a technique in which a polyimide resin is used as a material for the insulating film in multilevel metal layers. And, in U.S. Pat. No. 4,040,083, the semiconductor chip is pretreated with an aluminum chelate compound for the purpose of improving the adhesion between the polyimide resin and $SiO_2$ film and improving the water resistance of the semiconductor device.

On the other hand, in order to prevent the soft errors caused by the α-rays emitted by the radioactive impurities, i.e. uranium and thorium, present in the encapsulation material in semiconductor memory device having a high integration density, there is a technique for forming an α-rays shielding layer in the circuit side of semiconductor memory chip, and in U.S. patent application Ser. No. 222,612 filed on Jan. 5, 1981 entitled "SEMICONDUCTOR MEMORIES AND PROCESS FOR PRODUCING THE SAME", there is disclosed a resin encapsulated semiconductor memory device in which a polyimide resin having a much minimized content of uranium and thorium is used as the shielding material.

According to these prior techniques, it is acknowledged that the most important problem in the resin encapsulated semiconductor device as compared with the case of ceramic encapsulation or glass encapsulation is that the resin has a nature of allowing the permeation of water and that, due to the difference in thermal expansion coefficient between the resin and the semiconductor substrate and invasion of water into the interface therebetween, a gap is formed between them which causes the permeation of water. For this reason, it is usual to treat the interstices between, for example, an undercoat resin and a semiconductor chip or metallic wire with a coupling agent.

As is known, there is a general tendency to require high water resistance of the resin materials used in the field of semiconductor devices. One of its examples is the extensive use of silicone resin as passivation material. However, silicone resin has a problem in that it is inferior in bonding strength to semiconductor substrates, metals and encapsulation resins.

Various polyimide resins and particularly polyimide-isoindoloquinazolinedione resin have become extensively employed in the field of integrated circuit because they have excellent characteristics such as heat resistance, insulating properties, coating film formability and the like and have bonding strength to semiconductor chips and metallic films.

However, the present inventors studied on semiconductors not only with the above-mentioned polyimide-isoindoloquinazolinedione resin but also with many kinds of polyimide resins to find that some of them developed failure after a longterm severe test for water vapor resistance. In order to research into the cause of the failure, the inventors studied on the water vapor resistance of encapsulation resins, bonding properties between encapsulation resins and polyimide film as an undercoat or a stabilizing film, and the bonding strength between the polyimide film and the semiconductor chip or metallic films. As a result, it was found that the most important cause of the failure was water absorption of the polyimide resin itself. It has hitherto been considered that permeation of water is impossible if the conductor chip and metallic film are solidly and tightly bonded to the polyimide film. However, the fact that failure due to water cannot be prevented even if the conductor chip is pre-treated with coupling agent so sufficiently leads to a conclusion that the problem cannot be solved by merely improving the bonding strength between the semiconductor chip and the polyimide resin. That is, this failure is considered ascribable to that polyimide resin absorbs water and acts as a storehouse of water.

SUMMARY OF THE INVENTION

It is an object of this invention to provide a resin encapsulated semiconductor device having a stabilizing film, an insulating film for multilevel metal layers or an α-rays shielding layer which is markedly improved in water resistance.

According to this invention, there is provided a semiconductor device comprising a functioning element comprising a semiconductor substrate, an electrically insulating film formed on said substrate, a metallic conductor formed on said insulating film and a polyimide resin film formed in contact with said conductor; a resin encapsulation for mechanically protecting and hermetically sealing said functioning element; and at least one outer lead extending from the encapsulation, wherein said polyimide resin is an aromatic polyimide resin having a water vapor absorption rate of 1% or less.

Hereunder, this invention will be explained in detail with reference to the attached drawings.

DETAILED EXPLANATION OF THE INVENTION

Figure 1:
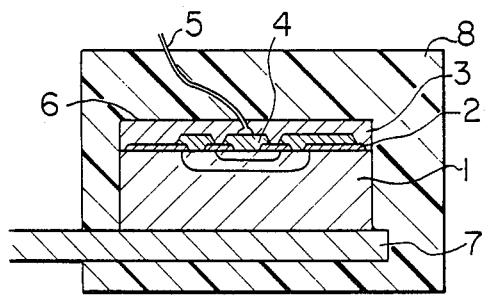
FIG. 1 is a sectional view illustrating the structure of a resin encapsulated semiconductor device of this invention.

As shown in FIG. 1, this invention is applied to a planar type transistor. The emitter electrode 4 and the base electrode 3 of transistor 1 bonded onto electrode 7 are made of, for example, aluminum and their pn-junction terminal surfaces are stabilized with passivation film 2 made of, for example, $SiO_2$. In this invention, the stabilization of pn-junction is further improved by applying a specified moisture-resistant polyimide coating 6 to their whole surfaces. Thereafter, resin encapsulation is carried out with epoxy resin 8.

Figure 2:
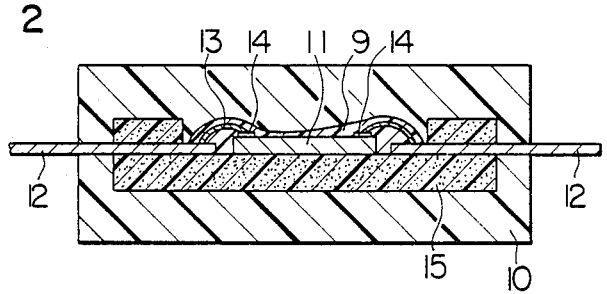
FIG. 2 is a sectional view illustrating the structure of another resin encapsulated semiconductor device to which this invention has been applied.

FIG. 2 is a semiconductor device obtained by resin encapsulating an integrated circuit, wherein semiconductor integrated circuit 11 is fixed on package 15 made of ceramic or the like and bonding pad 14 provided around integrated circuit chip 11 and external connection lead terminals 12 are interconnected with thin metallic wire 13. An undercoat film 9 made from a moisture resistant polyimide resin is provided so as to cover integrated circuit chip 11, thin metallic wire 13, lead terminal 12 connected to metallic wire 13 and bonding pad 14 as a whole. Further its outside is encapsulated with molding resin 10. This invention is applicable also to thick film circuits.

Figure 3:
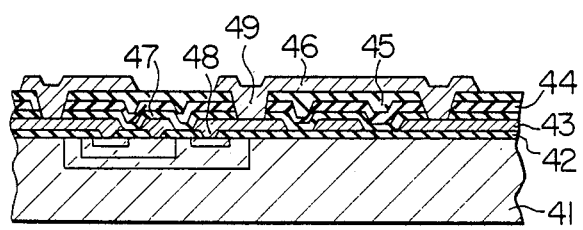
FIG. 3 is a sectional view illustrating the structure of a resin encapsulated semiconductor device having multilevel metal layers to which this invention has been applied.

FIG. 3 shows another embodiment. On a substrate 41 in which a semiconductor element is made, a silicon dioxide film 42 is provided. The first conductor layer 43 having a predetermined pattern is electrically connected with the semiconductor element via the through-holes provided in predetermined places of the silicon dioxide film 42, and it overlies the silicon dioxide film 42. A silicon dioxide film 47 is subsequently provided on the layer 43 and the film 42 by a well-known process such as the sputtering and the chemical vapor deposition. After through-holes 49 are provided at predetermined parts of the silicon dioxide film 47, conductive projections being trapezoidal in section are disposed at the parts of the holes.

Thereafter, a film 44 of an intermediate layer is formed optionally. Further, a polymer resin film 45 of polyimide is formed. The layers of polyimide and the intermediate layer and the polymer resin which cover the tops of the trapezoidal projections are etched by such means as exposure to a plasma discharge atmosphere, ion beam irradiation, and sputtering. Then, the second conductor layer 46 is formed. According to the embodiment, since the insulating film is of the double structure consisting of the polymer resin 45 and the silicon dioxide film 47, it is one of very excellent insulating property without any pinhole.

Figure 4:
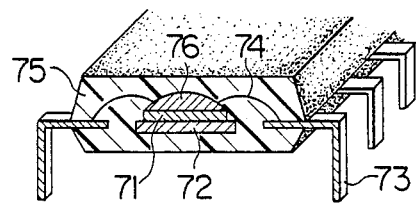
FIG. 4 is a perspective sectional view illustrating the structure of a resin encapsulated memory according to this invention.

Formation of the α-rays shielding layer between the package and the memory elements is explained in detail referring to the attached drawings. FIG. 4 is a cutaway perspective view of a dual-in-line type resin package semiconductor memory device in which this invention is applied. In FIG. 4, numeral 71 denotes a semiconductor memory element, that is a silicon chip, numeral 72 denotes a support for silicon chip, numeral 73 denotes a lead, numeral 74 denotes a bonding wire, numeral 75 denotes a resin package, and numeral 76 denotes an α-rays shielding layer. In this example, the α-rays shielding layer 76 is coated on the surface of silicon chip. The resin package 75 can be formed by molding a thermosetting resin such as an epoxy resin.

A semiconductor has to have moisture resistance enough to pass a 1,000 hour test at 80° C. in 90% RH. It was found that all the polyimides passing this test had a saturated water absorption rate of 1.0% or less. Examples of such polyimide include polyimide resins having a structural recurring unit represented by the following general formula:

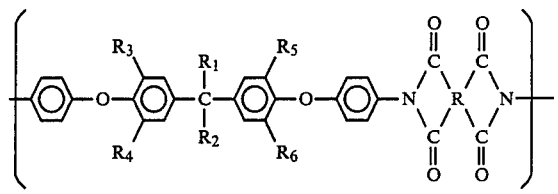

wherein R is an aliphatic or aromatic group; $R_1$ and $R_2$ are independently a hydrogen atom, an alkyl group having 1 to 4 carbon atoms or a $CF_3$ group; $R_3$ to $R_6$ are independently a hydrogen atom, a halogen atom or an alkyl group having 1 to 4 carbon atoms.

According to this invention, there can be provided a resin encapsulated semiconductor device wherein a film of the specified polyimide resin represented by the above-mentioned formula (I) is coated on a water-corrosive conductive material of aluminum circuit or the like so as to improve moisture resistance of the aluminum circuit layer and to make the characteristics better (i.e. to lessen the failure rate after a lapse of time). Further, in a semiconductor element having pn-junction, there can be provided an excellent element wherein the surface of semiconductor on which pn-junction is exposed is coated with a film of said polyimide resin so that the characteristics are not deteriorated by the water vapor present in the outer air.

In this invention, the thickness of the protecting coating film or the interlaminar insulating coating film is selected so as to fall in the range of about 1–300 μm. Thereafter, it is molded with a molding material. The thickness of the latter resin is generally selected so as to fall in a range of about 0.5–5 mm.

When used as an α-rays shielding material, the thickness of the polyimide resin is preferably 30 μm or more. If it is purified so that the contents of uranium and thorium become less than 1 ppb and particularly less than 0.1 ppb similarly to the case of encapsulating material, the emission of α-rays from the polyimide resin itself raises no practical problem. It is convenient to carry out the purification by distilling, subliming, recrystallizing or extracting the monomer and the solvent. Another purification is carried out so that the content of sodium becomes less than 1 ppm in order to lessen the corrosion and leakage at the time of moisture resistance test, and said purification can also be carried out in the same process as the aforementioned purification.

In this invention, the polyimide resin represented by the formula (I) or its precursor, polyamide acid resin, can be obtained by reacting an aromatic diamine and an aromatic tetracarboxylic acid dianhydride in equimolar proportions. This can be achieved by a solution polycondensation process, for example.

In the solution polycondensation process, a solvent is used for the reaction. Said solvent has to be able to dissolve both of the aromatic diamine and aromatic tetracarboxylic acid dianhydride. Examples of the reaction solvent usable in this invention include N,N-dimethylformamide, N,N-diethylformamide, dimethyl sulfoxide, N,N-dimethylacetamide, N,N-diethylacetamide, N-methyl-2-pyrrolidone and the like. Said reaction solvent may be used in the form of a mixture thereof in accordance with the need such as facilitating the procedure of dissolution.

Concrete examples of the aromatic tetracarboxylic acid dianhydride used in this invention include, for example, pyromellitic acid dianhydride (PMDA), benzophenonetetracarboxylic acid dianhydride (BTDA), 1,4,5,8-naphthalenetetracarboxylic acid dianhydride, 2,3,6,7-naphthalenetetracarboxylic acid dianhydride, 1,2,5,6-naphthalenetetracarboxylic acid dianhydride, 3,3',4,4'-diphenyltetracarboxylic acid dianhydride, 2,2',3,3'-diphenyltetracarboxylic acid dianhydride, 2,3,3',4'-diphenyltetracarboxylic acid dianhydride, 2,2-bis-(3,4-dicarboxyphenyl)propane dianhydride, 2,2-bis-[4-(3,4-dicarboxyphenoxy)phenyl]propane dianhydride, 2,2-bis-[4-(2,3-dicarboxyphenoxy)phenyl]propane dianhydride, bis(3,4-dicarboxyphenyl)sulfone dianhydride, bis-(3,4-dicarboxyphenyl) ether dianhydride, bis-(3,4-dicarboxyphenyl) methane dianhydride, perylene-3,4,9,10-tetracarboxylic acid dianhydride and the like. Their mixtures can also be used.

Concrete examples of the aromatic diamine usable in this invention include the following:
2,2-bis-[4-(4-aminophenoxy)phenyl]propane, 2,2-bis-[3-methyl-4-(4-aminophenoxy)phenyl]propane, 2,2-bis-[3-chloro-4-(4-aminophenoxy)phenyl]propane, 2,2-bis-[3-bromo-4-(4-aminophenoxy)phenyl]propane, 2,2-bis-[3-ethyl-4-(4-aminophenoxy)phenyl]propane, 2,2-bis-[3-propyl-4-(4-aminophenoxy)phenyl]propane, 2,2-bis-[3-isopropyl-4-(4-aminophenoxy)phenyl]propane, 2,2-bis-[3-butyl-4-(4-aminophenoxy)phenyl]propane, 2,2-bis-[3-sec-butyl-4-(4-aminophenoxy)phenyl]propane, 2,2-bis-[3,5-dimethyl-4-(4-aminophenoxy)phenyl]propane, 2,2-bis-[3,5-dichloro-4-(4-aminophenoxy)phenyl]propane, 2,2-bis-[3,5-dibromo-4-(4-aminophenoxy)phenyl]propane, 2,2-bis-[3-chloro-4-(4-aminophenoxy)-5-methylphenyl]propane, 2,2-bis-[4-(4-aminophenoxy)phenyl]hexafluoropropane, 2,2-bis-[3-methyl-4-(4-aminophenoxy)phenyl]hexafluoropropane, 2,2-bis-[3-chloro-4-(4-aminophenoxy)phenyl]hexafluoropropane, 2,2-bis-[3-bromo-4-(4-aminophenoxy)phenyl]hexafluoropropane, 2,2-bis-[3-ethyl-4-(4-aminophenoxy)phenyl]hexafluoropropane, 2,2-bis-[3-propyl-4-(4-aminophenoxy)phenyl]hexafluoropropane, 2,2-bis-[3-isopropyl-4-(4-aminophenoxy)phenyl]hexafluoropropane, 2,2-bis-[3-butyl-4-(4-aminophenoxy)phenyl]hexafluoropropane, 2,2-bis-[3-sec-butyl-4-(4-aminophenoxy)phenyl]hexafluoropropane, 2,2-bis-[3,5-dimethyl-4-(4-aminophenoxy)phenyl]hexafluoropropane, 2,2-bis-[3,5-dichloro-4-(4-aminophenoxy)phenyl]hexafluoropropane, 2,2-bis-[3,5-dibromo-4-(4-aminophenoxy)phenyl]hexafluoropropane, 2,2-bis-[3-chloro-4-(4-aminophenoxy)-5-methylphenyl]hexafluoropropane, 1,1-bis-[4-(4-aminophenoxy)phenyl]ethane, 1,1-bis-[3-methyl-4-(4-aminophenoxy)phenyl]ethane, 1,1-bis-[3-chloro-4-(4-aminophenoxy)phenyl]ethane, 1,1-bis-[3-bromo-4-(4-aminophenoxy)phenyl]ethane, 1,1-bis-[3-ethyl-4-(4-aminophenoxy)phenyl]ethane, 1,1-bis-[3-propyl-4-(4-aminophenoxy)phenyl]ethane, 1,1-bis-[3-isopropyl-4-(4-aminophenoxy)phenyl]ethane, 1,1-bis-[3-butyl-4-(4-aminophenoxy)phenyl]ethane, 1,1-bis-[3-sec-butyl-4-(4-aminophenoxy)phenyl]ethane, 1,1-bis-[3,5-dimethyl-4-(4-aminophenoxy)phenyl]ethane, 1,1-bis-[3,5-dichloro-4-(4-aminophenoxy)phenyl]ethane, 1,1-bis-[3,5-dibromo-4-(4-aminophenoxy)phenyl]ethane, 1,1-bis-[3-chloro-4-(4-aminophenoxy) 5-methylphenyl]ethane, bis-[4-(4-aminophenoxy)phenyl]methane, bis-[3-methyl-4-(4-aminophenoxy)phenyl]methane, bis-[3-chloro-4-(4-aminophenoxy)phenyl]methane, bis-[3-bromo-4-(4-aminophenoxy)phenyl]methane, bis-[3-ethyl-4-(4-aminophenoxy)phenyl]methane, bis-[3-propyl-4-(4-aminophenoxy)phenyl]methane, bis-[3-isopropyl-4-(4-aminophenoxy)phenyl]methane, bis-[3-butyl-4-(4-aminophenoxy)phenyl]methane, bis-[3-sec-butyl-4-(4-aminophenoxy)phenyl]methane, bis-[3,5-dimethyl-4-(4-aminophenoxy)phenyl]methane, bis-[3,5-dichloro-4-(4-aminophenoxy)phenyl]methane, bis-[3,5-dibromo-4-(4-aminophenoxy)phenyl]methane, bis-[3-chloro-4-(4-aminophenoxy) 5-methylphenyl]methane, 3,3-bis-[4-(4-aminophenoxy)phenyl]pentane, 1,1-bis-[4-(4-aminophenoxy)phenyl]propane, 3,3-bis-[3,5-dimethyl-4-(4-aminophenoxy)phenyl]pentane, 1,1-bis-[3,5-dimethyl-4-(4-aminophenoxy)phenyl]propane, 3,3-bis-[3,5-dibromo-4-(4-aminophenoxy)phenyl]pentane, 1,1-bis-[3,5-dibromo-4-(4-aminophenoxy)phenyl]propane, 2,2-bis-[4-(4-aminophenoxy)phenyl]butane, 2,2-bis-[3-methyl-4-(4-aminophenoxy)phenyl]butane, 2,2-bis-[3,5-dimethyl-4-(4-aminophenoxy)phenyl]butane, 2,2-bis-[3,5-dibromo-4-(4-aminophenoxy)phenyl]butane and the like.

In this invention, there can be used not only the polyimide resin and polyamide acid resin, but also any blends containing the polyamide acid resin.

Further, the following generally known diamines may be used in combination with the above-mentioned aromatic diamines, unless their use increases the moisture absorption rate too much: p-phenylenediamine, m-phenylenediamine, 4,4'-diamino-diphenylether, 4,4'-diamino-diphenylmethane, 4,4'-diamino-diphenylsulfone, 4,4'-diamino-diphenylpropane, 4,4'-diamino-diphenylsulfide, 1,5-diaminonaphthalene, 4,4'-diaminodiphenylethane, m-toluylenediamine, p-toluylenediamine, 3,4'-diaminobenzanilide, 1,4-diaminonaphthalene, 3,3'-dichloro-4,4'-diaminodiphenyl, benzidine, 4,4'-diaminodiphenylamine, 4,4'-diaminodiphenyl-N-methylamine, 4,4'-diaminodiphenyl-N-phenylamine, 3,3'-diaminodiphenylsulfone and the like.

The resulting polyamide acid is coated onto the element in the state of a varnish and is heated at a temperature of about 150°–400° C. for several hours to convert it into polyamide. Thereafter, the element is molded into a thickness of about 0.5–5 mm with a molding material such as an epoxy resin, diallyl phthalate resin, phenolic resin, unsaturated polyester resin, silicone resin or the like by a process of casting, transfer molding, injection molding or the like.

By the above-mentioned procedure, there is obtained a semiconductor device which is more excellent in moisture resistance than in the case of being protectingly coated with usual polyimide or the case of being resin encapsulated without protective coating.

Next, this invention will be explained by way of the following Examples, by which this invention is by no means limited.

EXAMPLE 1

0.1 Mole of 2,2-bis-[4-(4-aminophenoxy)phenyl]propane and 0.1 mole of pyromellitic acid dianhydride (hereinafter, simply referred to as "PMDA") were reacted in N-methyl-2-pyrrolidone (hereinafter, simply referred to as "NMP") at about 10° C. to obtain a varnish having a nonvolatile content of about 10% by weight.

This varnish was coated on an MOS type 16K-bit RAM element and heated at 100° C. for 1 hour and then at 200° C. for 2 hours and then at 250° C. for 2 hours to form a polyimide film having a thickness of about 40 μm on the surface of the element. Thereafter, the element was transfer molded with an epoxy resin molding material to obtain a resin encapsulated semiconductor device.

This semiconductor device had so excellent a failure rate as 0/935 as measured after being kept under a condition of 80° C./90% RH for 1,000 hours.

The soft error rate of this memory was 100 fits or less (1 fit is a unit indicating that one error occurs per one element per $10^9$ hours).

A polyimide film obtained under the same heating conditions as above had a saturated moisture absorption rate of 0.8% by weight at 25° C./75% RH.

COMPARATIVE EXAMPLE 1

0.1 Mole of 4,4'-diamino-diphenylether and 0.1 mole of PMPA were reacted in NMP at about 10° C. to obtain a varnish having a nonvolatile content of about 10% by weight.

In the same manner as in Example 1, the surface of an element was coated with this varnish and encapsulated with resin to obtain a semiconductor device. Its failure rate was 4/80 (5%) under the same conditions as mentioned above. The soft error rate of this memory was 100 fits or less, similar to the case of Example 1. This polyimide had a saturated moisture absorption rate of 3.1% by weight at 25° C./75% RH.

In the case of polyimide-isoindoloquinazolinedione, the saturated moisture absorption rate was 2.3% when cured at 350° C.

In the case of a product obtained by reacting a diamine having the following formula:

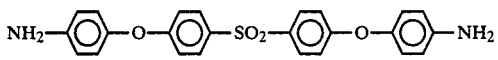

with pyromellitic acid dianhydride at a molar ratio of about 1:1 and curing the resulting polyamide acid at 250° C., the saturated moisture absorption rate was 1.8%.

EXAMPLE 2

0.1 Mole of 2,2-bis-[4-(4-aminophenoxy)phenyl]propane and 0.1 mole of benzophenonetetracarboxylic acid dianhydride (hereinafter simply referred to as "BTDA") were reacted in NMP at about 10° C. to obtain a varnish having a nonvolatile content of about 15% by weight.

After forming a thermally oxidized film (SiO$_2$) having a thickness of 5,500 Å on a Si substrate and depositing aluminum under vacuum to give a film thickness of 1 μm thereon, a first circuit conductor layer was formed according to a conventional process. The above-mentioned varnish was coated thereon and heated at 100° C. for one hour and then at 200° C. for 5 hours to form a polyimide resin interlaminar insulating film having a thickness of about 2 μm. Then, after forming through-holes, a second layer of aluminum circuit was arranged, over which PSG was formed to a thickness of 5,000 Å by CVD (chemical vapor deposition) method. After bonding, the above-mentioned varnish was coated and baked to form a polyimide resin protecting film having a thickness of about 45 μm.

The resulting element was transfer molded with an epoxy resin molding material to obtain a resin encapsulated semiconductor device.

When this semiconductor device was allowed to stand in an atmosphere of 80° C./90% RH, no abnormality was observed even after 1,000 hours.

This polyimide film had a saturated moisture absorption rate of 0.75% by weight at 25° C./75% RH.

COMPARATIVE EXAMPLE 2

0.1 Mole of 4,4'-diamino-diphenylether and 0.1 mole of BTDA were reacted in NMP at about 10° C. to obtain a varnish having a nonvolatile content of about 15% by weight.

The test was conducted in the same manner as in Example 2, except that the above-mentioned varnish was used. As a result, an abnormality was observed after 800 hours. Thus, the product was regarded as a defective product and disintegrated. The aluminum circuit of the element was corroded at many places in both of the first and second layers.

This polyimide had a saturated moisture absorption rate of 2.8% by weight at 25° C./75% RH.

EXAMPLE 3

0.1 Mole of 2,2-bis-[4-(4-aminophenoxy)phenyl]propane, 0.04 mole of PMDA and 0.06 mole of BTDA were reacted in NMP at about 10° C. to obtain a varnish having a nonvolatile content of about 15% by weight. Application of this varnish to a resin encapsulated diode will be mentioned below.

A polyimide resin film was formed by coating said varnish on the side surface of a semiconductor element along the pn-junction and then drying and heating it at 100° C. for 2 hours and then at 200° C. for 3 hours. The element was molded with an epoxy resin to obtain a resin encapsulated semiconductor device, which was allowed to stand in an atmosphere of 80° C./90% RH. After 1,000 hours, the failure rate was 2/380 (0.5%).

This polyimide film had a saturated moisture absorption rate of 0.78% by weight at 25° C./75% RH.

COMPARATIVE EXAMPLE 3

A resin encapsulated diode was produced by repeating the procedure of Example 3, except that the polyimide resin film of Comparative Example 1 was applied. This resin encapsulated diode was tested under the same conditions as in Example 3. The failure rate was 260/360 (72%).

EXAMPLE 4

0.1 Mole of 2,2-bis-[4-(4-aminophenoxy)phenyl]hexafluoropropane and 0.1 mole of PMDA were reacted in NMP at about 10° C. to obtain a varnish having a nonvolatile content of about 15% by weight.

In the same manner as in Example 1, a polyimide film having a thickness of 60 μm was formed from this varnish. The resulting element was transfer molded with an epoxy resin molding material to give a resin encapsulated semiconductor device.

The soft error rate of this memory was 100 fits or less. When a pressure cooker test (hereinafter, simply referred to as PCT) was conducted by allowing the device to stand in a saturated steam at 120° C. and 2 atmospheres, the failure rate after the lapse of 200 hours was as excellent as 0/60.

This polyimide film had a saturated moisture absorption rate of 0.57% by weight.

COMPARATIVE EXAMPLE 4

0.1 Mole of 4,4'-diamino-diphenylmethane and 0.1 mole of PMDA were reacted in NMP at about 10° C. to obtain a varnish having a nonvolatile content of about 15% by weight. The test was conducted in the same manner as in Example 4, except that the above-mentioned varnish was used. As a result, the failure rate was 7/55 (31%). The soft error rate of this memory was as excellent as 100 fits.

This polyimide film had a saturated moisture absorption rate of 2.0% by weight at 25° C./75% RH.

EXAMPLE 5

0.1 Mole of 2,2-bis-[4-(4-aminophenoxy)phenyl]butane and 0.1 mole of BTDA were reacted in NMP at about 10° C. to obtain a varnish having a nonvolatile content of about 15% by weight.

This varnish was coated on an MOS type 40 pin LSI and heated at 100° C. for 1 hour and then at 200° C. for 1 hour and then at 250° C. for 3 hours to form a protecting film of polyimide resin having a thickness of about 4 μm. Thereafter, the element was transfer molded with an epoxy resin molding material to obtain a resin encapsulated semiconductor device.

The PCT was practised with this semiconductor device, and the failure rate was as excellent as 0/120 after the lapse of 180 hours.

This polyimide film had a saturated moisture absorption rate of 0.65% by weight at 25° C./75% RH.

COMPARATIVE EXAMPLE 5

Without applying the polyimide coating of Example 5, encapsulation was carried out with the same epoxy resin as in Example 5.

In the PCT of this LSI, the failure rate was 52/130 (40%) after the lapse of 200 hours.

EXAMPLE 6

0.1 Mole of 2,2-bis-[3-bromo-4-(4-aminophenoxy)phenyl]propane, 0.06 mole of PMDA and 0.04 mole of BTDT were reacted in NMP at about 10° C. to obtain a varnish having a nonvolatile content of about 15% by weight.

By the same procedure as mentioned in Example 2, an interlaminar insulating film of polyimide resin having a thickness of about 1.5 μm was formed, and then a protecting film of polyimide resin having a thickness of 35 μm was formed by the same method as mentioned above. Thereafter, the element was molded with an epoxy resin molding material to obtain a resin encapsulated semiconductor device.

When it was allowed to stand in an atmosphere of 80° C./90% RH, the failure rate was as excellent as 0/720 after the lapse of 1,000 hours.

This polyimide film had a saturated moisture absorption rate of 0.68% by weight at 25° C./75% RH.

COMPARATIVE EXAMPLE 6

0.1 Mole of m-phenylenediamine, 0.06 mole of PMDA and 0.04 mole of BTDA were reacted in NMP at about 10° C. to obtain a varnish having a nonvolatile content of about 15% by weight.

A device was produced in the same manner as in Example 6, except that the above-mentioned varnish was used. When the device was allowed to stand in an atmosphere of 80° C./90% RH, the failure rate was 200/680 (30%) after the lapse of 1,000 hours. Disintegration of the defective product revealed that the aluminum circuit was corroded at many places.

This polyimide film had a saturated moisture absorption rate of 5.2% by weight at 25° C./75% RH.

EXAMPLES 7-10

The polyamide acid varnish obtained in Example 1 and the polyamide acid varnish obtained in Comparative Example 1 were mixed together in proportions shown in Table 1 to give four kinds of mixed polyamide acid varnishes. With these varnishes, resin molded RAMs were prepared in the same manner as in Example 1, and their moisture resistance test was carried out.

TABLE 1

| | Polyamide acid varnish of Example 1:Polyamide acid varnish of Comparative Example 1 | Saturated water vapor absorption rate at 25° C./75% RH (% by wt.) | Failure rate after 1000 hours at 80° C./90% RH (pieces/pieces) |
|---|---|---|---|
| Example 7 | 90:10 | 0.9 | 0/194 |
| Example 8 | 80:20 | 1.1 | 3/188 |
| Example 9 | 70:30 | 1.3 | 7/192 |
| Example 10 | 50:50 | 1.7 | 6/195 |

As has been explained above, according to this invention, a semiconductor device excellent in moisture resistance can be provided by forming a protecting film or an interlaminar insulating film comprising a specified polyimide film on the semiconductor surface on which the aluminum circuit conductor and the pn-junction are exposed.

What is claimed is:

1. A resin encapsulated semiconductor device which comprises:
- a functioning element comprising a semiconductor substrate having at least one pn-junction exposed to the surface thereof, an electrically insulating film formed on the main surface of said substrate, a conductor formed on said insulating film, and an insulating layer of polyimide resin in contact with said conductor;
a resin encapsulation for mechanically protecting and hermetically sealing said functioning element, said encapsulation being closely adhered to an outer surfae of said functioning element; and
at least one outer lead extending from the encapsulation, wherein said polyimide resin is an aromatic polyimide resin having a saturated water absorption rate of 1% by weight or less at 25° C./75% RH, said aromatic polyimide polymer having recurring units represented by the formula:

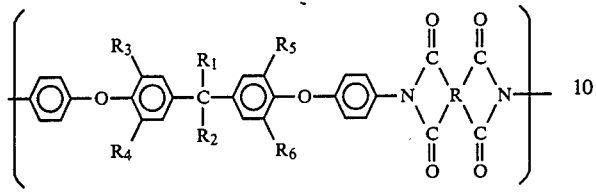

wherein R is an aliphatic group or an aromatic group; $R_1$ and $R_2$, which are the same or different, are a hydrogen atom, an alkyl group having 1-4 carbon atoms, or $CF_3$; and $R_3$ to $R_6$, which are the same or different, are a hydrogen atom, a halogen atom or an alkyl group having 1-4 carbon atoms.

2. A semiconductor memory device according to claim 1, wherein $>R<$ is a group of

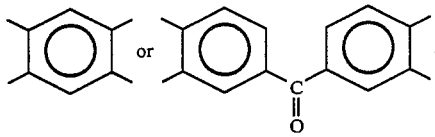

3. A semiconductor memory device according to claim 1, wherein said aromatic polyimide is a dehydrated polymer of a reaction product of pyromellitic acid dianhydride and 2,2'-[4-(4-aminophenoxy)phenyl]propane.

4. A semiconductor memory device according to claim 1, wherein said aromatic polyimide is a dehydrated polymer of a reaction product of benzophenone tetracarboxylic acid dianhydride and 2,2'-[4-(4-aminophenoxy)phenyl]propane.

* * * * *